(12) United States Patent
Loechelt

(10) Patent No.: US 9,831,334 B2
(45) Date of Patent: Nov. 28, 2017

(54) ELECTRONIC DEVICE INCLUDING A CONDUCTIVE ELECTRODE

(71) Applicant: SEMICONDUCTOR COMPONENTS INDUSTRIES, LLC, Phoenix, AZ (US)

(72) Inventor: Gary H. Loechelt, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/198,526

(22) Filed: Jun. 30, 2016

(65) Prior Publication Data

US 2016/0315185 A1   Oct. 27, 2016

Related U.S. Application Data

(62) Division of application No. 13/794,020, filed on Mar. 11, 2013, now Pat. No. 9,412,862.

(51) Int. Cl.
*H01L 29/78* (2006.01)
*H01L 29/06* (2006.01)
(Continued)

(52) U.S. Cl.
CPC .... *H01L 29/7809* (2013.01); *H01L 21/28132* (2013.01); *H01L 29/063* (2013.01);
(Continued)

(58) Field of Classification Search
CPC .................. H01L 29/7809; H01L 21/28132
See application file for complete search history.

(56) References Cited

U.S. PATENT DOCUMENTS

| 5,204,277 A | 4/1993 | Somero et al. |
| 5,856,228 A * | 1/1999 | Miwa ................ H01L 29/66272 148/DIG. 10 |

(Continued)

OTHER PUBLICATIONS

"Multigate Transistors as the Future of Classical Metal-Oxide_ Semiconductor Field-Effect Transistors" by Isabelle Ferain, Cynthia A. Colinge and Jean-Pierre Colinge; Nature 479, 310-316 (Nov. 17, 2011).

(Continued)

*Primary Examiner* — Moazzam Hossain
(74) *Attorney, Agent, or Firm* — Abel Law Group, LLP

(57) ABSTRACT

An electronic device can include a semiconductor layer, an insulating layer overlying the semiconductor layer, and a conductive electrode. In an embodiment, a first conductive electrode member overlies the insulating layer, and a second conductive electrode member overlies and is spaced apart from the semiconductor layer. The second conductive electrode member has a first end and a second end opposite the first end, wherein each of the semiconductor layer and the first conductive electrode member are closer to the first end of the second conductive electrode member than to the second end of the second conductive electrode member. In another embodiment, the conductive electrode can be substantially L-shaped. In a further embodiment, a process can include forming the first and second conductive electrode members such that they abut each other. The second conductive electrode member can have the shape of a sidewall spacer.

21 Claims, 11 Drawing Sheets

(51) Int. Cl.
*H01L 29/08* (2006.01)
*H01L 29/10* (2006.01)
*H01L 29/40* (2006.01)
*H01L 29/66* (2006.01)
*H01L 21/28* (2006.01)
*H01L 29/423* (2006.01)

(52) U.S. Cl.
CPC ...... *H01L 29/0865* (2013.01); *H01L 29/0882* (2013.01); *H01L 29/1095* (2013.01); *H01L 29/402* (2013.01); *H01L 29/42376* (2013.01); *H01L 29/66712* (2013.01); *H01L 29/66719* (2013.01); *H01L 29/66734* (2013.01); *H01L 29/7802* (2013.01); *H01L 29/7812* (2013.01); *H01L 29/7813* (2013.01); *H01L 29/66727* (2013.01)

(56) References Cited

U.S. PATENT DOCUMENTS

| | | | |
|---|---|---|---|
| 6,184,081 B1 | 2/2001 | Jeng et al. | |
| 7,282,765 B2 | 10/2007 | Xu et al. | |
| 7,868,379 B2 | 1/2011 | Loechelt | |
| 7,902,017 B2 | 3/2011 | Loechelt | |
| 7,989,857 B2 | 8/2011 | Loechelt | |
| 8,076,716 B2 | 12/2011 | Loechelt | |
| 8,202,775 B2 | 6/2012 | Loechelt | |
| 8,519,474 B2 | 8/2013 | Loechelt | |
| 2006/0180947 A1* | 8/2006 | Loechelt | H01L 21/761 257/510 |
| 2009/0032889 A1* | 2/2009 | Zhu | H01L 21/28105 257/410 |
| 2010/0258863 A1* | 10/2010 | Kaneko | H01L 21/28132 257/330 |
| 2010/0327350 A1 | 12/2010 | Loechelt et al. | |
| 2011/0068344 A1* | 3/2011 | Loechelt | H01L 29/0873 257/66 |
| 2011/0193160 A1* | 8/2011 | Loechelt | H01L 21/743 257/337 |
| 2014/0175553 A1* | 6/2014 | Miyata | H01L 29/7831 257/365 |

OTHER PUBLICATIONS

"A High Performance Planar Power MOSFET" by Richard W. Coen, Dah Wen Tsang, and Kenneth P. Lisiak, Members IEEE; IEEE Transactions on Electron Devices, vol. ED. 27, No. 2, Feb. 1980.

* cited by examiner

ELECTRONIC DEVICE INCLUDING A CONDUCTIVE ELECTRODE

CROSS-REFERENCE TO RELATED APPLICATION

The present application is a divisional application of U.S. patent application Ser. No. 13/794,020, filed Mar. 11, 2013, entitled "Electronic Device Including a Conductive Electrode and a Process of Forming the Same," by Gary H. Loechelt, which is incorporated by reference herein in its entirety.

FIELD OF THE DISCLOSURE

The present disclosure relates to electronic devices and processes of forming electronic devices, and more particularly to, electronic devices including conductive electrodes and processes of forming the same.

RELATED ART

An insulated gate field-effect transistor (IGFET) is a common type of transistor that can be used in power switching circuits. The IGFET includes a source region, a drain region, a channel region extending between the source and drain regions, and a gate structure adjacent to the channel region. The gate structure includes a gate electrode disposed adjacent to and separated from the channel region by a gate dielectric layer.

Power transistors should have a low on-state resistance and a low figure of merit. Conductive electrodes can be used to help reduce drain-to-gate capacitance. The conductive electrodes can be formed as part of a metallization layer when forming contacts to the source region of the transistor. Such conductive electrodes may restrict where interconnect may be placed. Further, the conductive electrodes may not have an optimal design in reducing drain-to-gate capacitance.

BRIEF DESCRIPTION OF THE DRAWINGS

Embodiments are illustrated by way of example and are not limited in the accompanying figures.

Figure 1:
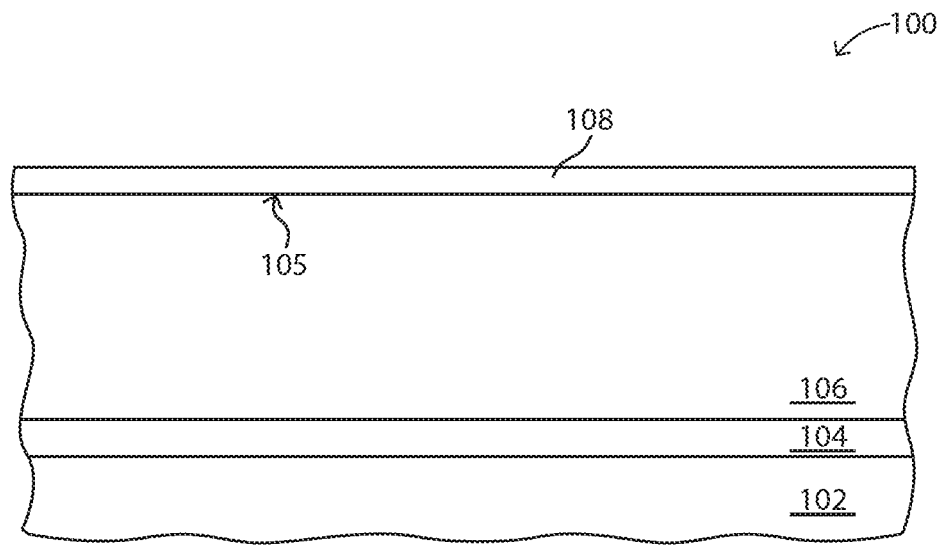
FIG. 1 includes an illustration of a cross-sectional view of a portion of a workpiece including a buried conductive region, a buried insulating layer, a semiconductor layer, and a dielectric layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "horizontally-oriented" and "vertically-oriented," with respect to a region or structure, refer to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 10 V difference maintained between the source and drain or emitter and collector of the transistor when the transistor is in an off-state. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single embodiment is described herein, more than one embodiment may be used in place of a single embodiment. Similarly, where more than one embodiment is described herein, a single embodiment may be substituted for that more than one embodiment.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a conductive electrode. In an embodiment, the conductive electrode can include a first conductive electrode member and a second conductive electrode member. As seen from a cross-sectional view, lengths of the first and second conductive electrode members can lie along lines that intersect each other. In an embodiment, the first conductive electrode member can lie a long a plane substantially parallel to a primary surface, and the second conductive electrode member can lie along a plane substantially perpendicular to the primary surface. The conductive electrode can be substantially L-shaped.

The conductive electrode can be useful in reducing drain-to-gate capacitance because the first conductive electrode member can be disposed between a gate electrode and a vertical conductive region coupled to a drain of the transistor. Further, the second conductive electrode member can help to confine higher electrical fields at elevations above the vertical conductive region. The lower drain-to-gate capacitance can allow the transistor to be switched more quickly, which is particularly useful for a power transistor that needs to switch between states relatively quickly. Further, the second conductive electrode member of the conductive electrode can allow for contact openings to be more easily made to both the gate electrode and the conductive electrode during the same contact etch sequence. The conductive electrode and its formation are better understood with the embodiments described below, which are to merely illustrate and not limit the scope of the present invention.

FIG. 1 includes an illustration of a cross-sectional view of a portion of a workpiece 100 that includes a buried conductive region 102, a buried insulating layer 104, a semiconductor layer 106, and a dielectric layer 108. The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least approximately $1 \times 10^{19}$ atoms/cm$^3$, and lightly doped is intended to mean a peak dopant concentration of less than approximately $1 \times 10^{19}$ atoms/cm$^3$. The buried conductive region 102 can be a portion of a heavily doped substrate (e.g., a heavily n-type doped wafer) or may be a buried doped region disposed over a substrate of opposite conductivity type or over another buried insulating layer (not illustrated) that is disposed between a substrate and the buried conductive region 102. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer The buried insulating layer 104 is disposed over the buried conductive region 102. During normal operation, the buried insulating layer 104 helps to isolate the voltage on the buried conductive region 102 from portions of the semiconductor layer 106. The buried insulating layer 104 can include an oxide, a nitride, or an oxynitride. The buried insulating layer 104 can include a single film or a plurality of films having the same or different compositions. The buried insulating layer 104 can have a thickness in a range of at least approximately 0.2 micron or at least approximately 0.3 micron. Further, the buried insulating layer 104 may have a thickness no greater than approximately 5.0 microns or no greater than approximately 2.0 microns. In a particular embodiment, the buried insulating layer 104 has a thickness in a range of approximately 0.5 micron to approximately 0.9 micron. The buried insulating layer 104 is not required, and in another embodiment, the semiconductor layer 106 can be formed on the buried conductive region 102.

The semiconductor layer 106 is disposed over the buried insulating layer 104 and has a primary surface 105 where the transistors and other electronic components (not illustrated) are formed. The semiconductor layer 106 can include a Group 14 element and any of the dopants as described with respect to the buried conductive region 102 or dopants of the opposite conductivity type. In an embodiment, the semiconductor layer 106 is a lightly doped n-type or p-type epitaxial silicon layer having a thickness in a range of approximately 0.2 micron to approximately 5.0 microns, and a doping concentration no greater than approximately $1 \times 10^{17}$ atoms/cm$^3$, and in another embodiment, a doping concentration of at least approximately $1 \times 10^{14}$ atoms/cm$^3$. The semiconductor layer 106 may be disposed over all of the workpiece 100. The dopant concentration within the semiconductor layer 106 as formed or before selectively doping regions within the semiconductor layer 106 will be referred to as the background dopant concentration.

The dielectric layer 108 can be formed over the semiconductor layer 106 using a thermal growth technique, a deposition technique, or a combination thereof. The dielectric layer 108 can include an oxide, a nitride, an oxynitride, or any combination thereof. In an embodiment, the dielectric layer 108 includes an oxide and has a thickness in a range of approximately 11 nm to approximately 50 nm.

Figure 2:
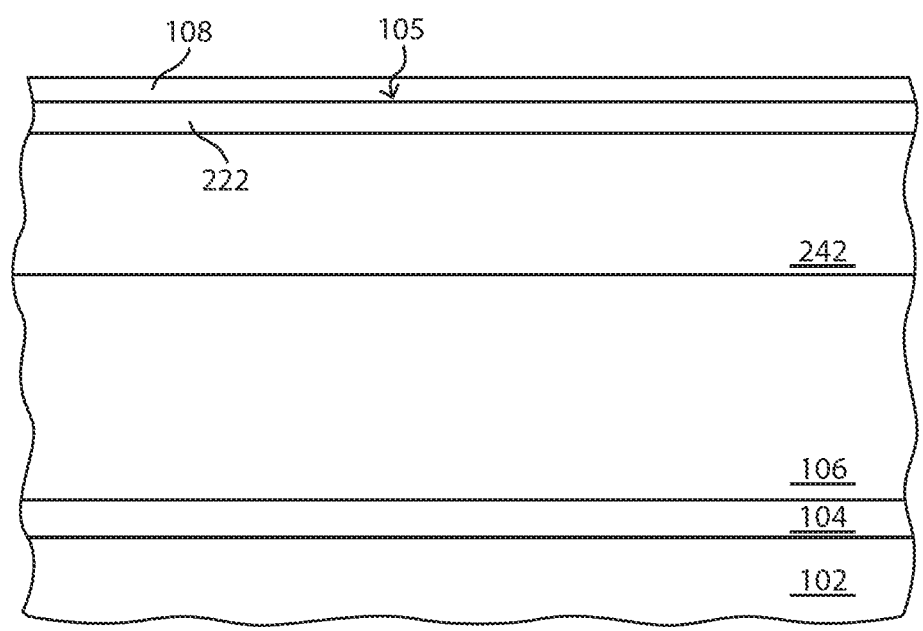
FIG. 2 includes an illustration of a cross-sectional view of the workpiece of FIG. 1 after forming a horizontally-oriented doped region and a resurf region.

FIG. 2 illustrates the workpiece after forming horizontally-oriented doped regions 222 and resurf regions 242, wherein one of each is illustrated in FIG. 2. Within a power transistor being formed, the horizontally-oriented doped regions 222 can be at least part of a drain region of a transistor. In a normal operating state, the charge carriers (for example, electrons) or current flows through the horizontally-oriented doped regions 222 principally in a horizontal direction. The horizontally-oriented doped regions 222 can have a dopant concentration of less than approximately $1 \times 10^{19}$ atoms/cm$^3$ and at least approximately $1 \times 10^{16}$ atoms/cm$^3$ and a depth in one embodiment of less than approximately 0.9 micron, and in another embodiment of less than approximately 0.5 micron. In a particular embodiment, the horizontally-oriented doped regions 222 are n-type doped.

The resurf regions 242 can help keep more current flowing through the horizontally-oriented doped regions 222 instead of into the semiconductor layer 106 underlying the horizontally-oriented doped regions 222. The resurf regions 242 may have a dopant concentration of no greater than approximately $5 \times 10^{17}$ atoms/cm$^3$ and at least approximately $1 \times 10^{16}$ atoms/cm$^3$, and a depth in one embodiment of less than approximately 1.5 microns, and in another embodiment of less than approximately 1.2 microns. The peak concentration of the resurf regions 242 may be in a range of approximately 0.5 micron to approximately 0.9 micron below the primary surface 105. In a particular embodiment, the resurf regions 242 are p-type doped.

In an embodiment, the horizontally-oriented doped regions 222 can be formed before the resurf regions 242. In another embodiment, the horizontally-oriented doped regions 222 can be formed after the resurf regions 242.

Figure 3:
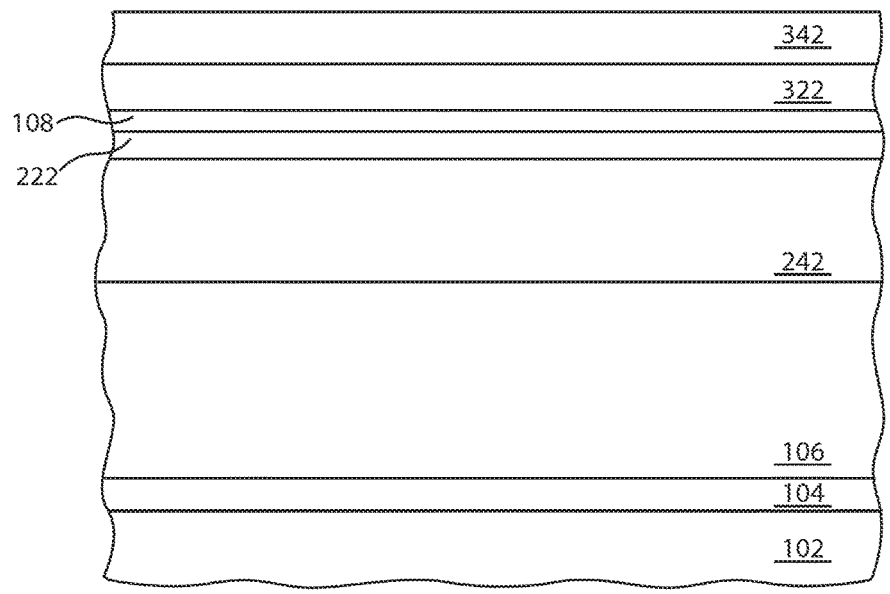
FIG. 3 includes an illustration of a cross-sectional view of the workpiece of FIG. 2 after forming an insulating layer and a conductive layer.

FIG. 3 includes an illustration after forming an insulating layer 322 and a conductive layer 342. The insulating layer 322 can formed using a thermal growth technique, a deposition technique, or a combination thereof. The insulating layer 322 can include an oxide, a nitride, an oxynitride, or any combination thereof. In an embodiment, the insulating layer 322 includes a nitride and has a thickness in a range of approximately 20 nm to approximately 90 nm. The conductive layer 342 is deposited over the insulating layer 322. The conductive layer 342 includes a conductive material or may be made conductive, for example, by doping. More particularly, the conductive layer 342 can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer 342 has a thickness in a range of approximately 0.05 micron to approximately 0.5 micron. In a particular embodiment, the conductive layer 342 will be used to form parts of conductive electrodes that can help to reduce drain-to-gate capacitance.

Figure 4:
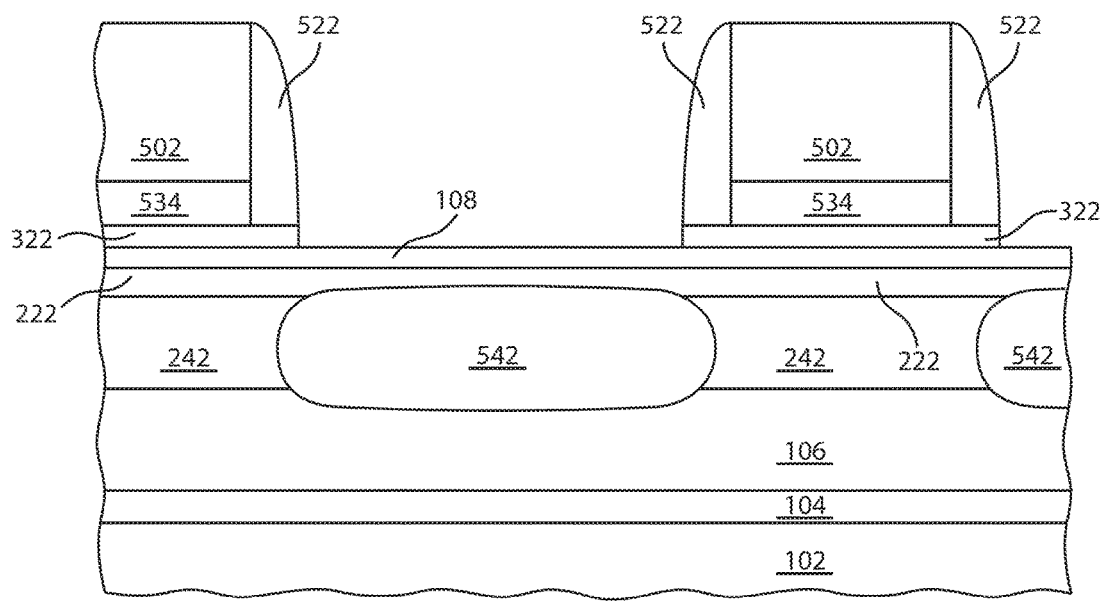
FIG. 4 includes an illustration of a cross-sectional view of the workpiece of FIG. 3 after forming insulating members, patterning the conductive layer to form conductive electrode members, insulating sidewall spacers, and deep body doped regions.

FIG. 4 includes an illustration after forming an insulating layer 502, patterning the insulating layer 502, patterning the conductive layer 342 to form conductive electrode members 534, and forming insulating spacers 522 and deep body doped regions 542. The insulating layer 502 can be formed by forming one or more insulating layers. In the embodiment as illustrated in FIG. 4, an insulating layer 502 is deposited over the conductive layer 342. The insulating layer 502 can include an oxide, a nitride, an oxynitride, or an organic dielectric. The insulating layer 502 has a thickness in a range of approximately 0.2 micron to approximately 2.0 microns.

A masking layer (not illustrated) is formed over the insulating layer 502 and patterned to define an opening where the transistor is being formed. Portions of the conductive layer 342 are patterned, and the masking features are removed. Remaining portions of the conductive layer 342 are conductive electrode members 534 that can help to reduce drain-to-gate capacitance in the transistor. The insulating spacers 522 are formed along the sidewalls of the conductive electrode members 534 and the insulating layer 502. In a particular embodiment, the insulating spacers 522 include a nitride and are formed by depositing a nitride layer to a thickness in a range of approximately 20 nm to approximately 90 nm and anisotropically etching the nitride layer to form the insulating spacers 522. Openings defined by the insulating spacers 522 are disposed over portions of the semiconductor layer 106 where deep body doped regions 542 and source and channel regions will be formed.

The deep body doped regions 542 can provide alternative paths during avalanche breakdown between the drain region of the transistor and the deep body doped regions 542 as opposed to avalanche breakdown between the drain region and a subsequently-formed channel region. Thus, if avalanche breakdown involving the drain region would occur, current flows through the deep body doped regions 542 in preference to the channel region. Therefore, the channel region is less likely to be permanently altered if avalanche breakdown occurs. The depths and concentrations of the deep body doped regions 542 may be related to the depths and concentrations of the channel region.

In an embodiment, the peak concentration of the deep body doped regions 542 is at least approximately 0.1 micron deeper than the peak concentration of the channel region, and in another embodiment, the peak concentration of the deep body doped regions 542 is no greater than approximately 0.9 micron deeper than the peak concentration of the channel region. In a further embodiment, the peak concentration of the deep body doped regions 542 is in a range of approximately 0.6 micron to approximately 1.1 microns below the primary surface 105. The deep body doped regions 542 can be formed using a single implant or a combination of implants. The deep body doped regions 542 may or may not contact the buried insulating layer 104. For a single implant or for the implant (of a combination of implants) having the lowest projected range, the dose can be in a range of approximately $5 \times 10^{13}$ ions/cm$^2$ to approximately $5 \times 10^{14}$ ions/cm$^2$.

Figure 5:
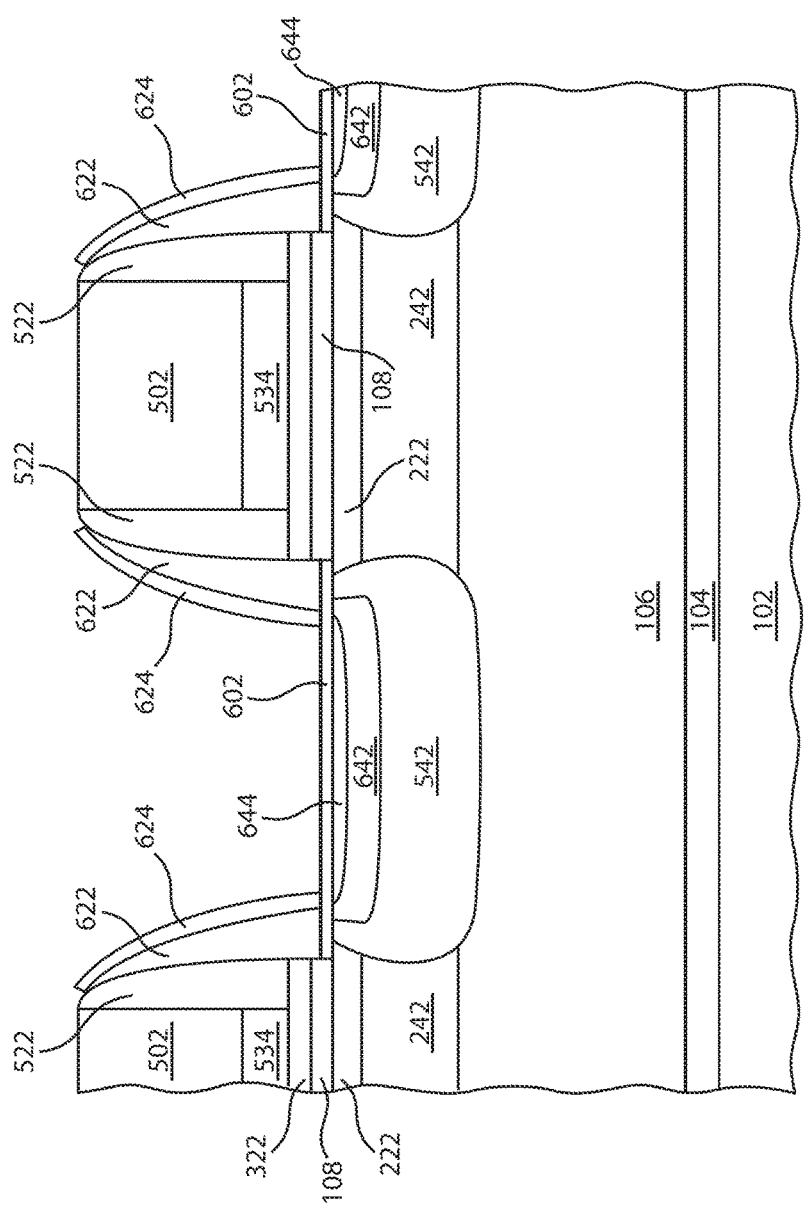
FIG. 5 includes an illustration of a cross-sectional view of the workpiece of FIG. 4 after forming body regions, gate electrodes, an insulating layer, and source regions.

FIG. 5 includes an illustration of the workpiece after forming a gate dielectric layer 602, gate electrodes 622, an insulating layer 624 along exposed surfaces of the gate electrodes 622, body regions 642, and source regions 644. The body regions 642 may include channel regions for the transistor. The body regions 642 can reduce the likelihood of punchthrough between the source and drain of the transistor structures. The body regions 642 have the same conductivity type as the channel region and the deep body doped regions 542 and can have a peak dopant concentration of at least approximately $1 \times 10^{18}$ atoms/cm$^3$. In another embodiment, not illustrated, a channel region for the transistor may be formed separately, and in such an embodiment, the body regions 642 reduces the likelihood of having more resistive regions between the channel region and the deep body doped regions 542, as compared to not having the body regions 642. Such channel regions can be formed by ion implantation with a dose in a range of approximately $5 \times 10^{12}$ ions/cm$^2$ to approximately $5 \times 10^{13}$ ions/cm$^2$. The energy can be selected to achieve a projected range of approximately 0.05 micron to approximately 0.3 micron. In another embodiment, one or more implants can be used to tailor the dopant concentrations and profiles under or spaced apart from the gate electrodes 622 to achieve a desire threshold voltage, channel-to-drain breakdown voltage, or other electrical characteristic. After reading this specification, skilled artisans will be able to determine dopant steps, doses, and projected ranges to achieve proper dopant concentrations and locations of doped regions for a particular application.

The exposed portions of the dielectric layer 108 are removed by etching, and the gate dielectric layer 602 is formed over the exposed surface along the bottoms of the openings. In a particular embodiment, the gate dielectric layer 602 includes an oxide, a nitride, an oxynitride, or any combination thereof and has a thickness in a range of approximately 5 nm to approximately 50 nm. The gate electrodes 622 are disposed over the gate dielectric layer 602 and are spaced apart and electrically isolated from the conductive electrode members 534. The gate electrodes 622 can be formed by depositing a layer of material that is conductive as deposited or can be subsequently made conductive. The layer of material can include a metal-containing or semiconductor-containing material. In an embodiment, the layer is deposited to a thickness of approximately 0.1 micron to approximately 0.5 micron. The layer of material is etched to form the gate electrodes 622. In the illustrated embodiment, the gate electrodes 622 are formed without using a mask and have shapes of sidewall spacers. The widths of the gate electrodes 622 at their bases are substantially the same as the thickness of the layer as deposited.

The insulating layer 624 can be thermally grown from the gate electrodes 622 or may be deposited over the workpiece. The thickness of the insulating layer 624 can be in a range of approximately 10 nm to approximately 30 nm. The source regions 644 are formed from portions of the body regions 642. The source regions 644 can include extension portions and a heavily doped portion. The extension portions can have a dopant concentration higher than approximately $5 \times 10^{17}$ atoms/cm$^3$ and less than approximately $5 \times 10^{19}$ atoms/cm$^3$. If needed or desired, an additional set of insulating spacers (not illustrated) may be formed before forming the heavily doped portions of the source regions 644. Such insulating spacers are formed to cover parts of the extension portions of the source regions 644 and to displace the heavily doped portions further from the gate electrodes 622. The insulating spacers can be formed by depositing an insulating layer and anisotropically etching the insulating layer. The insulating spacers can include an oxide, a nitride, an oxynitride, or any combination thereof, and have widths at the bases of the insulating spacers in a range of approximately 50 nm to approximately 200 nm.

The doping for the heavily doped portions of the source regions 644 can be performed after the insulating layer 624 is formed. The heavily doped portions of the source regions 644 allows ohmic contacts to be subsequently made and have a dopant concentration of at least approximately $1 \times 10^{19}$ atoms/cm$^3$. The source regions 644 can be formed using ion implantation, have an opposite conductivity type as compared to the body regions 642, and the same conductivity type as the horizontally-oriented doped regions 222 and the buried conductive region 102.

Figure 6:
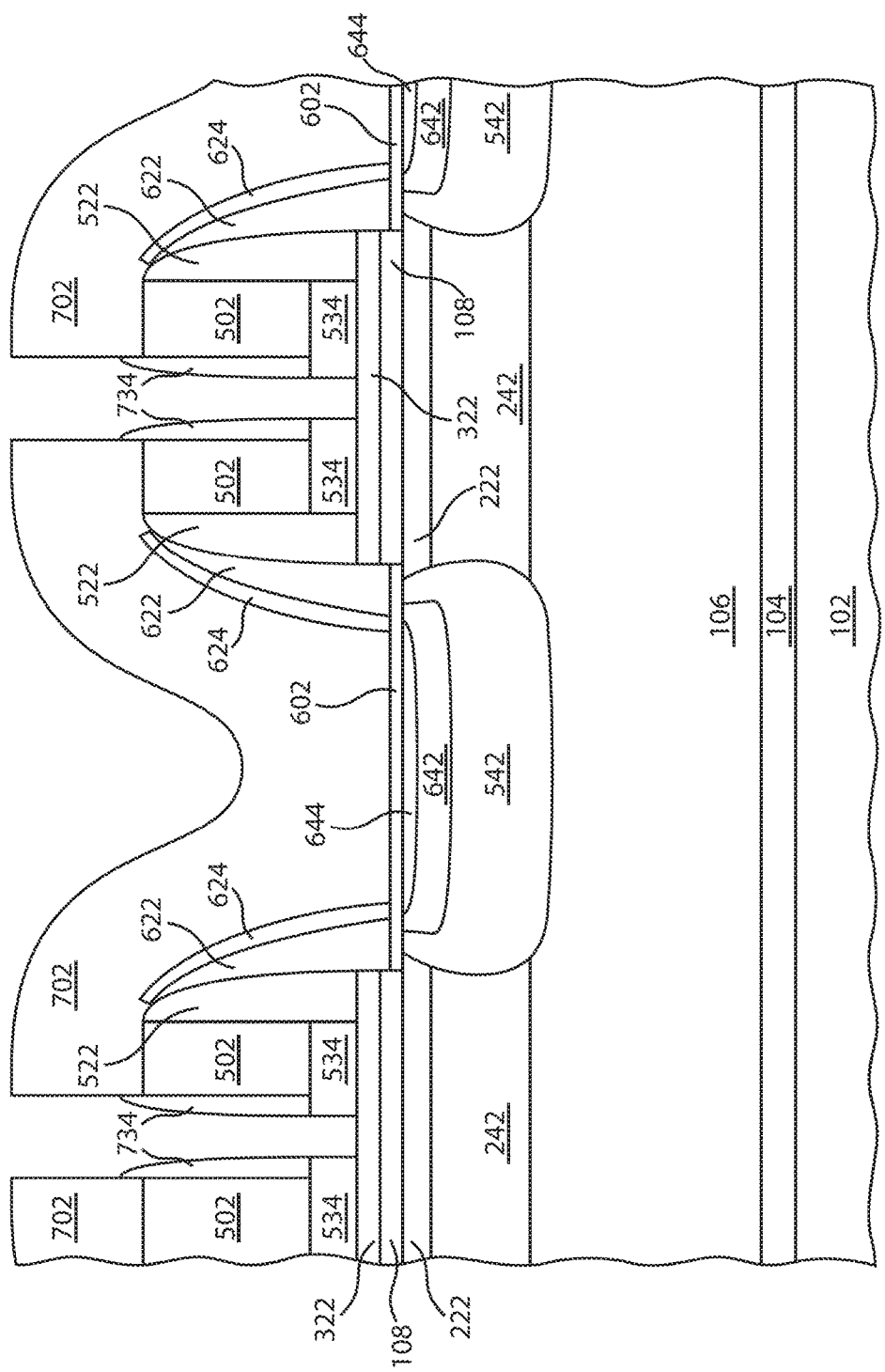
FIG. 6 includes an illustration of a cross-sectional view of the workpiece of FIG. 5 after forming a patterned interlevel dielectric layer and forming conductive electrode members within openings defined by the patterned interlevel dielectric layer.

FIG. 6 includes an illustration of the workpiece after forming an interlevel dielectric (ILD) layer 702 and the conductive electrode members 734. The ILD layer 702 is formed over the workpiece and can include an oxide, a nitride, an oxynitride, an organic dielectric, or any combination thereof. The ILD layer 702 can include a single film having a substantially constant or changing composition (e.g., a high phosphorus content further from the semiconductor layer 106) or a plurality of discrete films. An etch-stop film, an antireflective film, or a combination may be used within or over the ILD layer 702 to help with processing. The ILD layer 702 can be deposited to a thickness in a range of approximately 0.5 micron to approximately 2.0 microns. In the embodiment as illustrated in FIG. 6, the ILD layer 702 is not planarized. In another embodiment, the ILD layer 702 may be planarized if needed or desired. A patterned masking layer (not illustrated) is formed over the workpiece and defines openings under which openings in the ILD layer 702 will be subsequently formed. Exposed portions of the ILD layer 702 is etched to define the openings in which the conductive electrode members 734 will be subsequently formed. Etching is continued to etch through the source regions 644 and expose a portion of the body regions 642 along the bottom of the contact opening 1152. The patterned masking layer can be removed at this time.

The conductive electrode members 734 are formed along the sidewalls of the openings as illustrated in FIG. 6. The conductive electrode members 734 can allow for a more simplified process flow, more process margin, or both, as the conductive electrode members 734 extend to elevations higher than elevations of the conductive electrode members 534. The gate electrodes 622 have elevations at their uppermost points that are closer to elevations of the uppermost points of the conductive electrode members 734 than to the elevations of the uppermost points of the conductive electrode members 534. The average difference between the elevations of the uppermost points of the gate electrodes 622 and the elevations of the uppermost points of the conductive electrode members 734 may be no greater than approximately 0.2 micron. The average difference between the elevations of the uppermost points of the gate electrodes 622 and the elevations of the uppermost points of the conductive electrode members 534 may be at least approximately 0.4 micron.

The conductive electrode members 734 can be formed by depositing a layer of any of the materials as previously described with respect to the conductive layer 342. The layer for the conductive electrode members 734 and the conductive layer 342 can have the same or different compositions. The layer for the conductive electrode members 734 fills only part, and not all, of the openings and can have a thickness in a range of approximately 50 nm to approximately 400 nm. The layer is anisotropically etched to remove portions of the layer overlying the ILD layer 702. The etch can be continued to recess the uppermost points of the conductive electrode members 734 within the openings.

Some features of the electronic device at this point in the process are noteworthy. The conductive electrode members 534 and 734 abut each other, and combinations of the conductive electrode members 534 and 734 form the conductive electrodes. In the embodiment as illustrated, each of the conductive electrodes is substantially L-shaped. As illustrated in FIG. 6, the conductive electrode members 734 lie closer to particular ends of the conductive electrode members 534, and the gate electrodes 622 lie closer to opposite ends of the conductive electrode members 534. Thus, the gate electrodes 622 are closer to the conductive electrode members 534 than to the conductive electrode members 734. Thus, capacitive coupling between the gate electrodes 622 and the conductive electrodes can be reduced, as compared to having the conductive electrode members 734 along both ends of the conductive electrode members 534. As compared to distal ends of the conductive electrode members 734, proximal ends of the conductive electrode members 734 are closer to the semiconductor layer 106 and the conductive electrode members 534. Subsequently-formed contact openings will extend to the distal ends of the conductive electrode members 734, and in an embodiment, no contact openings will extend to the conductive electrode members 534.

Figure 7:
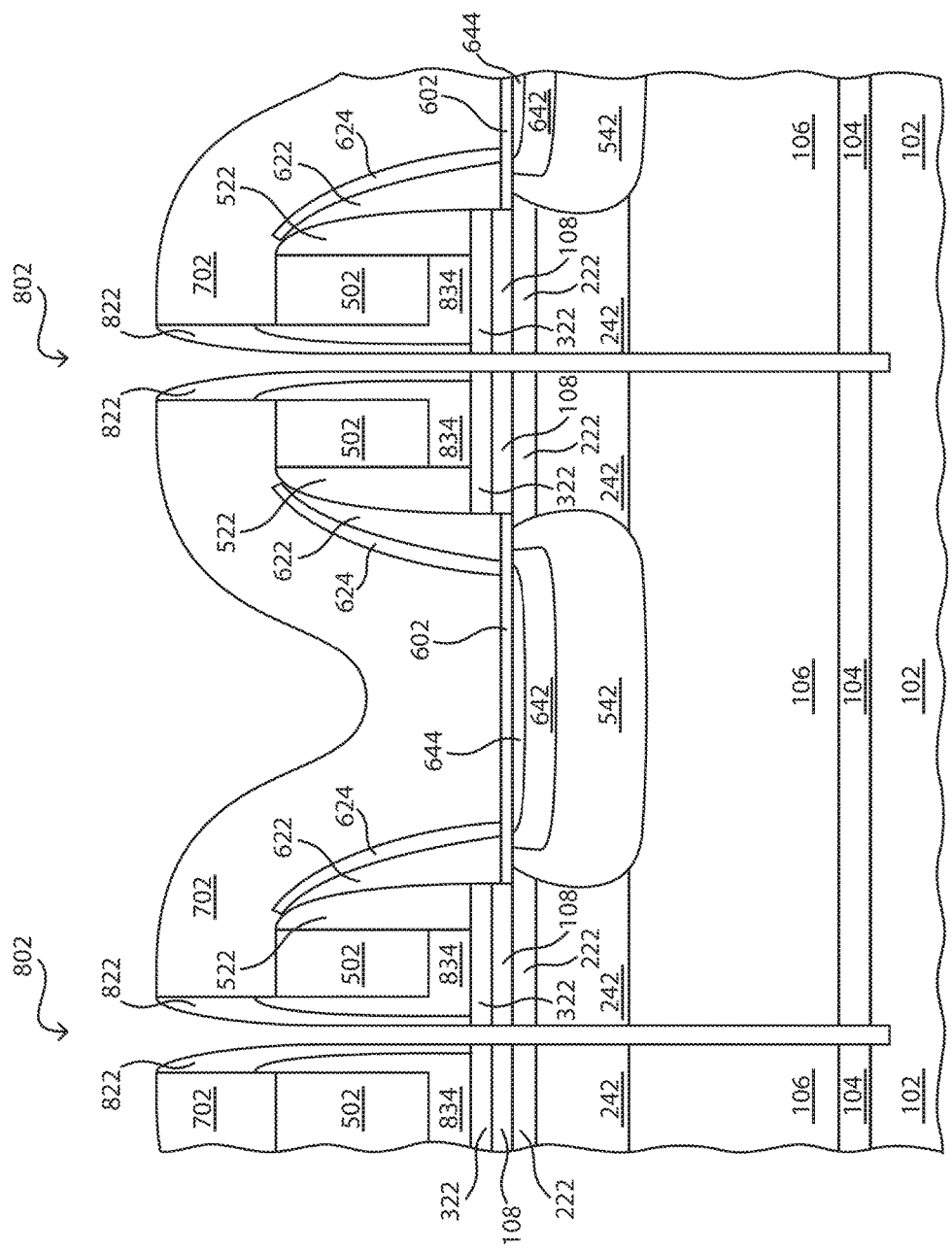
FIG. 7 includes an illustration of a cross-sectional view of the workpiece of FIG. 6 after forming insulating spacers and trenches extending to the buried conductive region.

FIG. 7 includes an illustration of the workpiece after forming insulating spacers 822 and trenches 802. The conductive electrode members 534 and 734 in FIG. 6 are illustrated as conductive electrodes 834 in FIG. 7. The insulating spaces 822 can be formed using any of the materials and formation techniques as previously described with respect to the insulating spacers 522. The insulating spacers 822 can be wider to allow for a sufficiently high enough breakdown voltage between the conductive electrodes 834 and subsequently-formed conductive plugs formed within the trenches. In an embodiment, the layer used to form the insulating spacers can be deposited to a thickness, as measured in nm, that is approximately 10 times the breakdown voltage, as measured in V. Thus, for a 20 V breakdown voltage, the layer for the insulating spacers 822 can be deposited to approximately 200 nm. The relationship between the voltage and thickness may be used for guidance and not as an absolute rule. In another embodiment, the layer can be deposited to a thickness in a range of approximately 110 nm to approximately 400 nm. Part of the exposed ILD layer 702 along its uppermost surface may be etched when forming the insulating spacers 822.

Portions of the insulating layer 322, the dielectric layer 108, the horizontally-oriented doped regions 222, the resurf regions 242, the semiconductor layer 106, and the buried insulating layer 104 are patterned to define trenches 802 that expose portions of the buried conductive region 102. In an embodiment, patterning can be formed using anisotropic etching. Part of the exposed ILD layer 702 along its uppermost surface may be etched when etching the insulating layer 322, the dielectric layer 108, the buried insulating layer 104, or any combination thereof. If needed or desired, etching can be continued to etch a portion of the buried conductive region 102. In an embodiment, the trenches 802 may extend at least approximately 0.2 micron into the buried conductive region 102, and in another embodiment, the trenches 802 may extend at least approximately 0.3 micron into the buried conductive region 102. In a further embodiment, the trenches 802 may extend no greater than approximately 5.0 micron into the buried conductive region 102, and in still a further embodiment, the trenches 802 may extend no greater than approximately 2.0 microns into the buried conductive region 102. In another embodiment, the trenches 802 may be deeper or shallower than described above. In a particular embodiment, the width of each of the trenches 802 is at least approximately 0.05 micron or approximately 0.1 micron, and in another particular embodiment, the width of each of the trenches 802 is no greater than approximately 2 microns or approximately 1 micron. Dimensions of the trenches 802 may be the same or different from each other.

In a further embodiment, the buried insulating layer 104 may not be present. The trenches 802 may extend completely or only partly to the buried conductive region 102. If the trenches 802 extent only partly, and not completely, to the buried conductive region 102, bottoms of the trenches 802 may be doped to ensure portions of the semiconductor layer 106 along the bottoms of the trenches are electrically connected to the buried conductive region 102.

A conductive layer is formed over the ILD layer 702 and within the trenches 802, and, in a particular embodiment, the conductive layer substantially completely fills the trenches 802. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/W. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of the refractory metals can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

Figure 8:
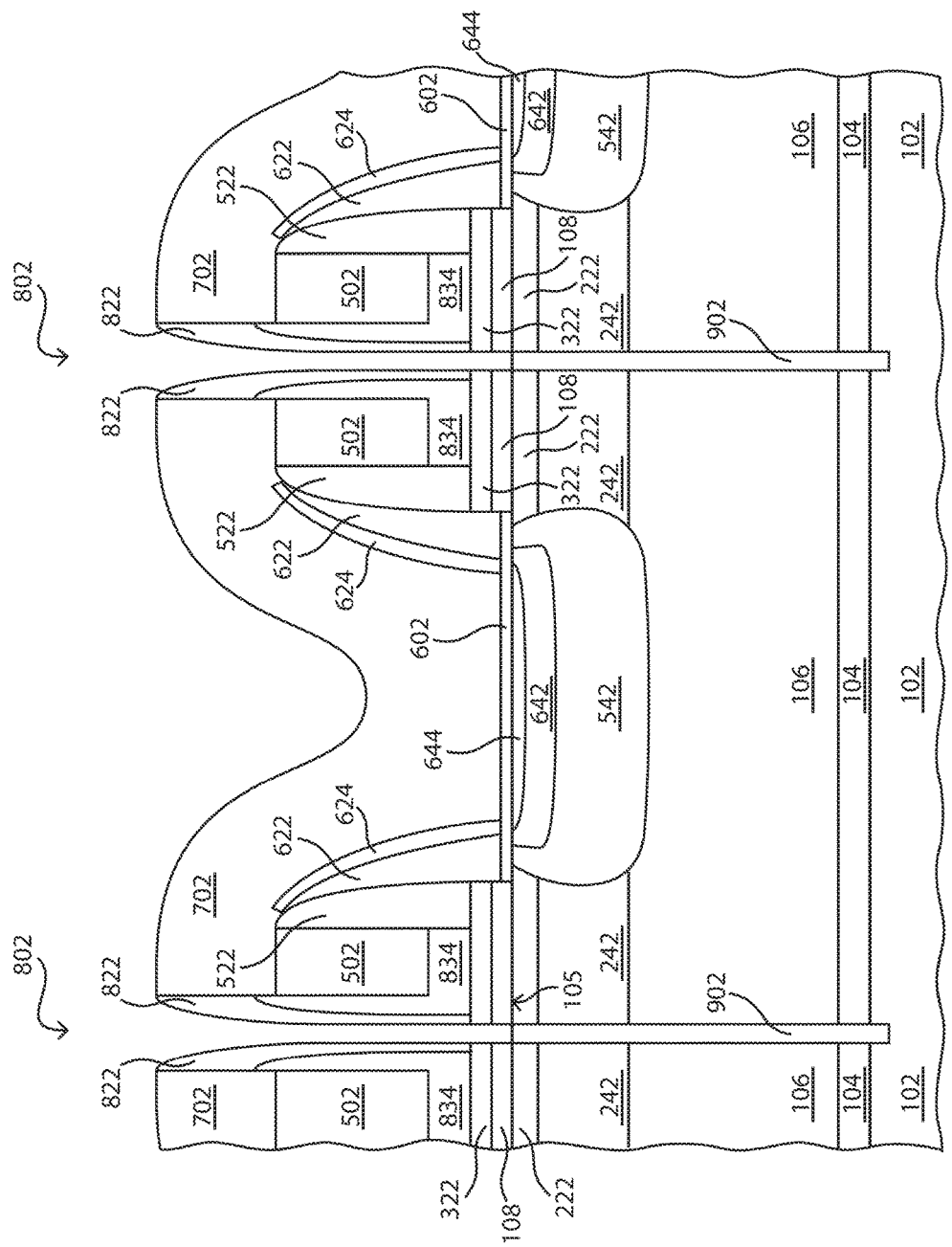
FIG. 8 includes an illustration of a cross-sectional view of the workpiece of FIG. 7 after forming conductive plugs within the trenches.

The portion of the conductive layer that is disposed over the ILD layer 702 is removed. The removal can be performed using a chemical-mechanical polishing or blanket etching technique. An etch or other removal operation is performed to recess the conductive layer further into the trenches 802 to form vertical conductive structures 902, as illustrated in FIG. 8. The vertical conductive structures 902 couple the horizontally-oriented doped regions 222 and the buried conductive region 102 to each other, and in the embodiment as illustrated in FIG. 8, electrically connect the horizontally-oriented doped regions 222 and the buried conductive region 102 to one another. The uppermost elevations of the vertical conductive structures 902 lie at least at the lowest elevations of the horizontally-oriented doped regions 222 immediately adjacent to the trenches 802. As the uppermost elevations of the vertical conductive structures 902 extend to elevations higher than the horizontally-oriented doped regions 222, parasitic capacitive coupling to the conductive electrodes 834 may become significant. In a particular embodiment, the vertical conductive structures 902 may extend to an elevation no higher than the primary surface 105. None of the vertical conductive structures 902 are covered by the conductive electrodes 834. From a top view, the vertical conductive structures are between immediately adjacent pairs of conductive electrode members 734 (not labeled in FIG. 8) of the conductive electrodes 834. In a finished electronic device, the buried conductive region 102 can provide an electrical connection to the drain of the transistor.

The vertical conductive structures 902 are examples of vertical conductive regions. In another embodiment, a different type of vertical conductive region may be used. For example, in an embodiment in which the buried insulating layer 104 is not present, the vertical conductive regions may be the vertical conductive structures 902 or may be formed by doping portions of the horizontally-oriented doped regions 222, resurf regions 242 and semiconductor layer 106 to form heavily doped regions extending from the horizontally-oriented doped regions 222 to the buried conductive region 102. The heavily doped regions have the same conductivity type as the horizontally-oriented doped regions 222 and can have a shape similar to the vertical conductive structures 902. The heavily doped regions may be formed using different implants at different energies, so that a relatively low resistance connection is made between the horizontally-oriented doped regions 222 and the buried conductive region 102. When the vertical conductive structures are replaced by the heavily doped regions, the heavily doped regions may be formed earlier in the process flow.

Figure 9:
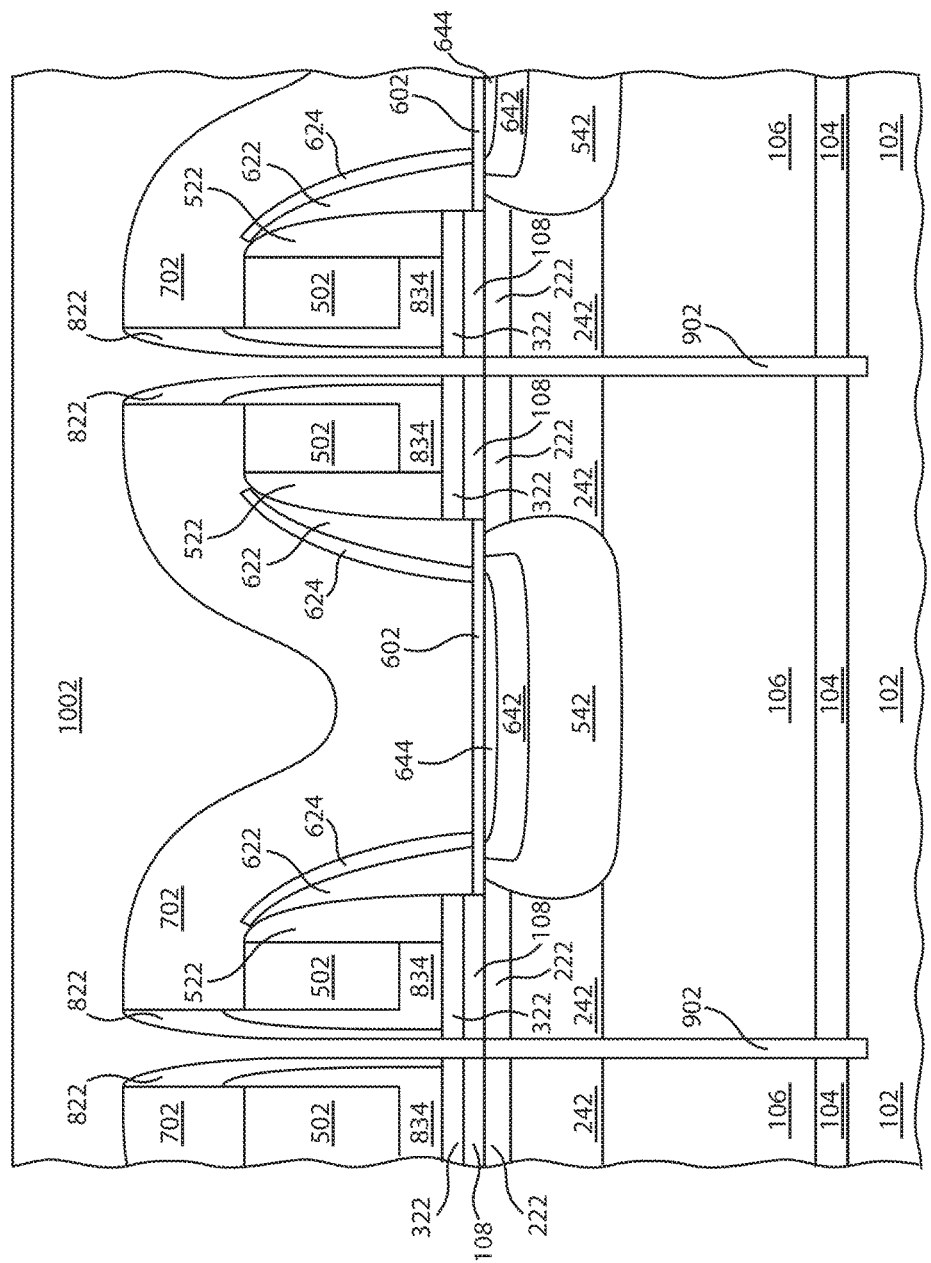
FIG. 9 includes an illustration of a cross-sectional view of the workpiece of FIG. 8 after forming another interlevel dielectric layer.

FIG. 9 includes an illustration of the workpiece after forming an ILD layer 1002 over the ILD layer 702. The ILD layer 1002 substantially completely fills remaining portions of the trenches 802. The ILD layer 1002 can include any of the materials, films, and thicknesses as previously described with respect to the ILD layer 702. The ILD layer 1002 can have the same or different materials, films, and thicknesses as compared to the ILD layer 702. The ILD layer 1002 can be planarized if needed or desired.

Figure 10:
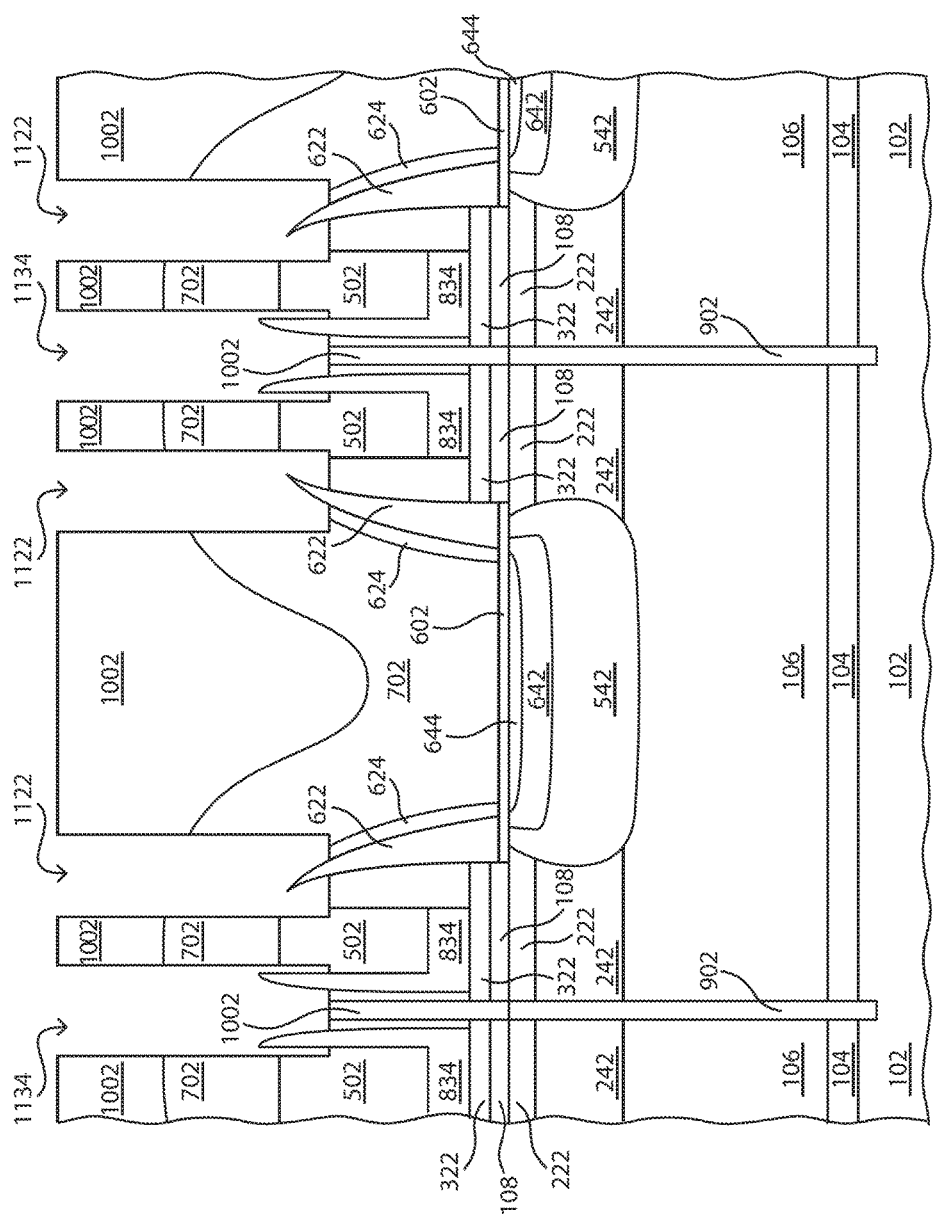
FIG. 10 includes an illustration of a cross-sectional view of the workpiece of FIG. 9 after patterning the interlevel dielectric layers to define contact openings to the conductive electrodes and the gate electrodes.

FIG. 10 includes an illustration after portions of the ILD layers 702 and 1002 and the insulating layer 502 are patterned to define contact openings 1122 and 1134. A patterned masking layer (not illustrated) is formed over the workpiece and defines openings under which conductive plugs will be subsequently formed. Exposed portions of the ILD layers 702 and 1002 and the insulating layer 502 are etched to define the contact openings 1122 and 1134. In the embodiment as illustrated in FIG. 10, the contact openings 1122 expose portions of the gate electrodes 622, and the contact openings 1134 expose portions of the conductive electrodes 834, and in particular, the conductive electrode members 734 (not labeled in FIG. 10) of the conductive electrodes 834. The patterned masking layer is removed after etching to define the contact openings 1122 and 1134.

Figure 11:
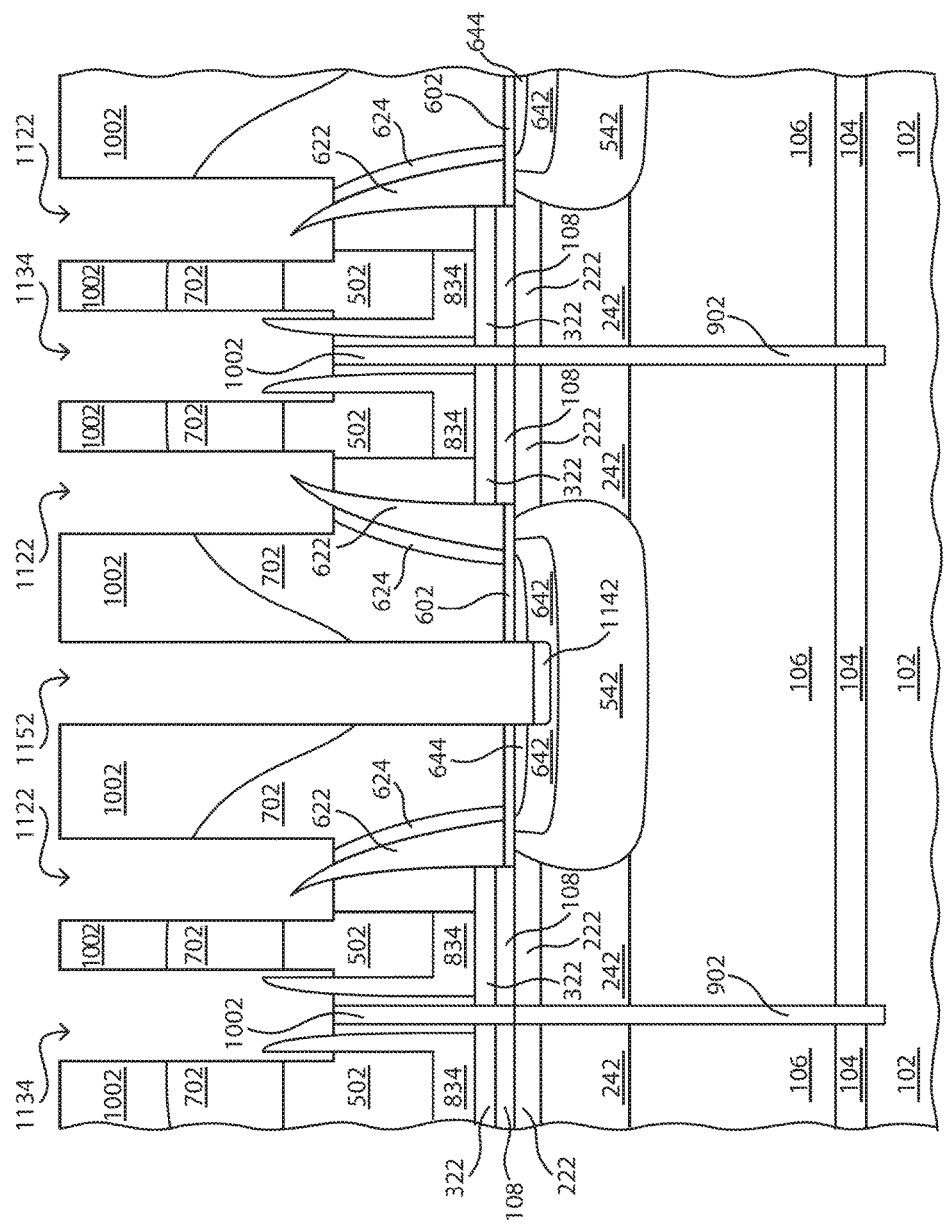
FIG. 11 includes an illustration of a cross-sectional view of the workpiece of FIG. 10 after patterning the other interlevel dielectric layer to define a contact opening extending to one of the body regions and forming a heavily doped region along a bottom of such opening.

FIG. 11 includes an illustration of the workpiece after patterning the ILD layers 1002 and 702 and the gate dielectric layer 602 to define an opening 1152 and after forming a heavily doped region 1142. The contact opening 1152 can be defined before or after the other contact openings illustrated and described in FIG. 10. The opening 1152 allows for a source/body contact to be made for the transistor. A patterned masking layer (not illustrated) is formed over the workpiece and defines openings under which conductive plugs will be subsequently formed. Exposed portions of the ILD layers 702 and 1002 and the gate dielectric layer 602 are etched to define the contact opening 1152. Etching is continued to etch through the source regions 644 and expose a portion of the body regions 642 along the bottom of the contact opening 1152. The patterned masking layer can be removed at this time. The bottom of the opening 1152 can be doped to form the heavily doped region 1142, which allows an ohmic contact to be formed to the body regions 642. The heavily doped region 1142 has the same conductivity type as body regions 642 and a dopant concentration of at least $1 \times 10^{19}$ atoms/cm$^3$.

In an embodiment, after defining the contact opening 1152 and before forming the heavily doped region 1142, a sacrificial layer (not illustrated) may be formed along exposed portions of source regions 644 to reduce the likelihood of counterdoping of the source regions 644. If needed or desired, the sacrificial layer may be anisotropically etched along the bottom of the opening 1152. The heavily doped region 1142 may be formed by ion implantation or another suitable doping technique. The workpiece may be annealed to activate the dopants introduced into the workpiece during the contact opening process sequence. After doping and anneal, the sacrificial layer is removed to expose portions of the source regions 644 within the contact opening 1152.

Figure 12:
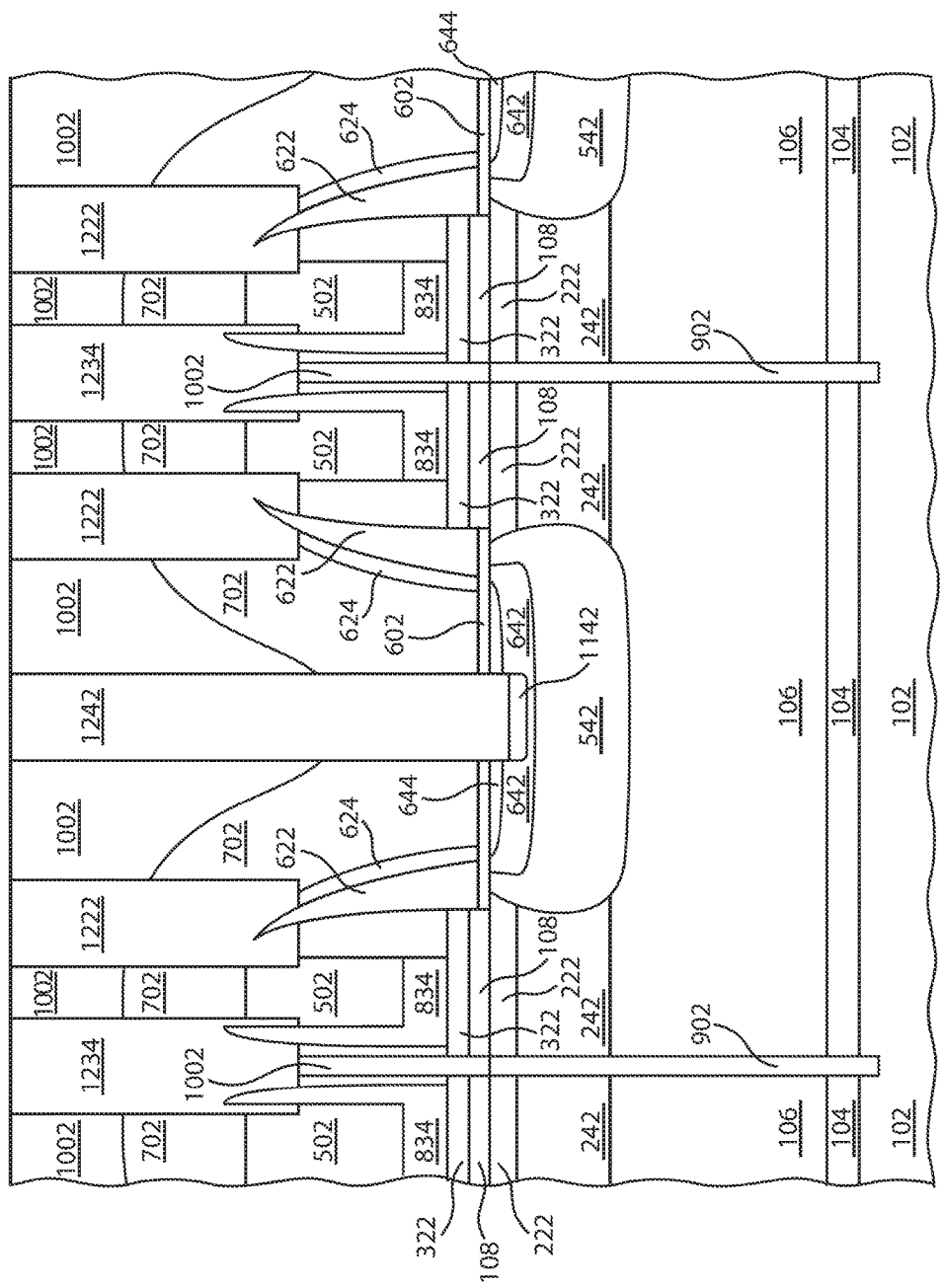
FIG. 12 includes an illustration of cross-sectional views of the workpiece of FIG. 11 after forming conductive plugs within the contact openings.

FIG. 12 includes an illustration after forming conductive plugs 1222, 1234, and 1242. The conductive plugs 1222 are electrically connected to the gate electrodes 622 of the transistor, the conductive plug 1242 is electrically connected to the source regions 644 and the body regions 642 of the transistor, the conductive plugs 1234 are electrically connected to the conductive electrodes 834. In an embodiment, none of conductive plugs within the ILD layer 702 is electrically connected to the horizontally-oriented doped regions 222. A drain for the transistor includes portions of the horizontally-oriented doped regions 222 that are electrically connected to the buried conductive region 102.

In an embodiment, the conductive plugs 1222, 1242, and 1234 can be formed using a plurality of films. In an embodiment, a layer including a refractory metal, such as Ti, Ta, W, Co, Pt, or the like, can be deposited over the workpiece and within the openings 1122, 1134, and 1152. If needed or desired, a layer including a metal nitride layer can be deposited over the layer including the refractory metal. The workpiece can be annealed so that portions of the layer including the refractory metal are selectively reacted with exposed silicon, such as substantially monocrystalline or polycrystalline silicon, to form a metal silicide. Thus, portions of the gate electrodes 622, conductive electrodes 834, source regions 644, horizontally-oriented doped regions 222, body regions 642, and heavily doped regions 1142 may react with the metal within the layer that includes the refractory metal to form a metal silicide. Portions of the layer including the refractory metal that contact an insulating layer do not react. A metal nitride layer may be formed to further fill a part, but not the remainder of the openings. The metal nitride layer can act as a barrier layer. A layer of a conductive material fills the remainder of the contact openings 1122, 1134, and 1152. Portions of the layer including the refractory metal, the metal nitride layer and the conductive material that overlies the ILD layer 1002 are removed to form the conductive plugs 1222, 1234, and 1242.

Figure 13:
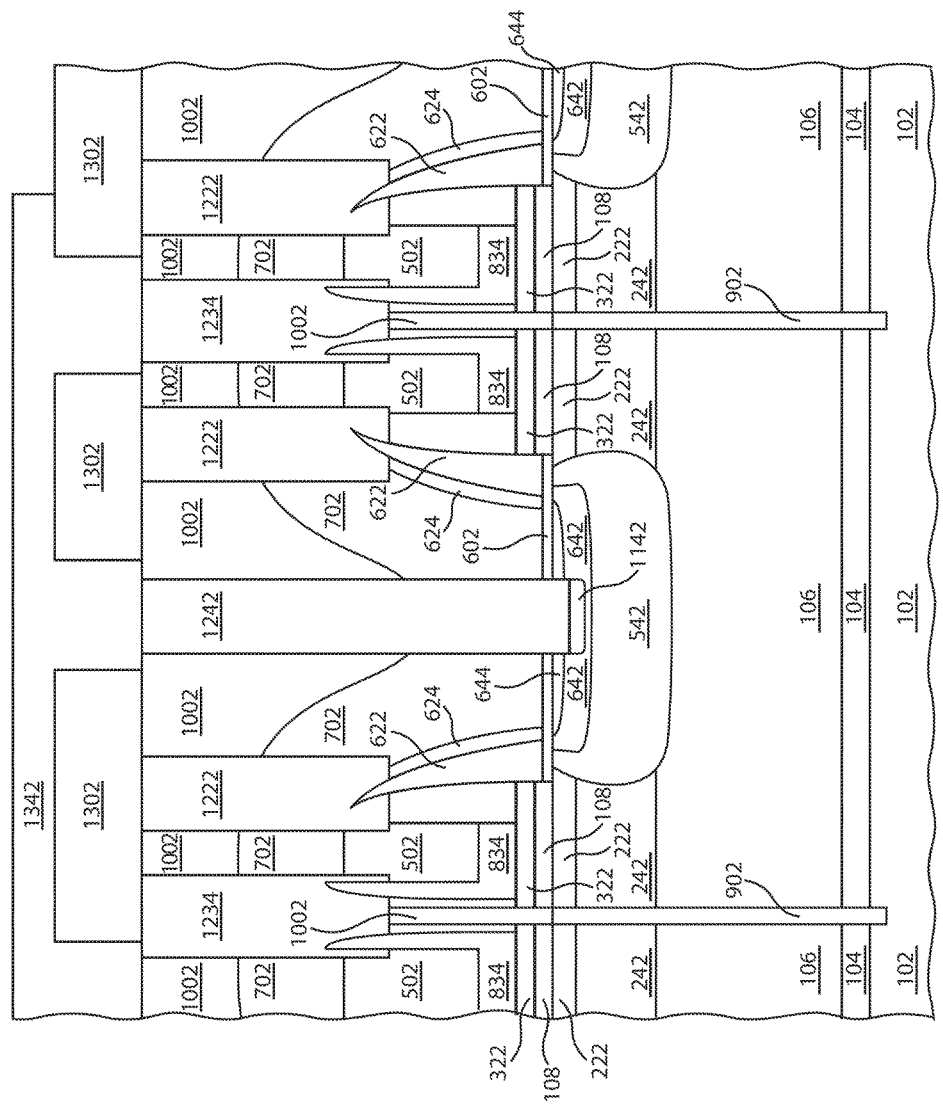
FIG. 13 includes an illustration of a cross-sectional view of the workpiece of FIG. 12 after forming a first level of interconnects.

FIG. 13 includes an illustration of the workpiece after a first level of interconnects are formed. An ILD layer 1302 can include any of the compositions as previously described with respect to the ILD layer 702. The ILD layer 1302 can have substantially the same composition or a different composition as compared to the ILD layer 702. The ILD layer 1302 is patterned to define via openings. Interconnect 1342 is formed and extends at least partly within the via openings within the ILD layer 1302. The interconnect 1342 electrically connects the source regions 644 of the transistor and the conductive electrodes 834 to one another, via conductive plugs 1234 and 1242. An interconnect (not illustrated) is electrically connected to the gate electrode 622 via the conductive plug 1222 at a location not illustrated in FIG. 13.

Although not illustrated, additional or fewer layers or features may be used as needed or desired to form the electronic device. Field isolation regions are not illustrated but may be used to help electrically isolate portions of the power transistor. In another embodiment, more insulating and interconnect levels may be used. A passivation layer can be formed over the workpiece or within the interconnect levels. After reading this specification, skilled artisans will be able to determine layers and features for their particular application.

The electronic device can include many other transistor structures that are substantially identical to the transistor structures as illustrated in FIG. 13. The transistor structures can be connected in parallel to each other to form the transistor. Such a configuration can give a sufficient effective channel width of the electronic device that can support the relatively high current flow that is used during normal operation of the electronic device. The transistor can be a power transistor that is well suited for use in power switching applications, such as a high-frequency voltage regulator.

In still another embodiment, one or more bipolar transistors may be used instead of the field-effect transistors. In this embodiment, current carrying electrodes can include emitter regions and collector regions instead of the source regions and drain regions, and control electrodes can include base regions instead of gate electrodes. If a buried collector is used, the buried collector can be patterned to allow a properly isolated connection to be made to the buried conductive region 102.

The conductive electrodes 834 as described herein can be useful in reducing drain-to-gate capacitance because the conductive electrode members 534 are disposed between the gate electrodes 622 and the vertical conductive regions, such as the vertical conductive structures 902. Further, the conductive electrode members 734 help to confine higher electrical fields at elevations above the conductive plugs 902. The lower drain-to-gate capacitance can allow for the transistor to be switched more quickly, which is particularly useful for a power transistor that is designed to switch between states relatively quickly or frequently.

The conductive electrode members 734 of the conductive electrodes 834 can allow for contact openings to be more easily made to both the gate electrodes 622 and to the conductive electrodes 834 during the same contact etch sequence. If the conductive electrode members 734 would not be present, contact openings would need to extend to the conductive electrode members 534. Because of the elevational differences between the tops of the gate electrodes 622 and the upper surface of the conductive electrode members 534, the contact openings for the gate electrodes 622 and conductive electrode members 534 may be formed at different times. Another masking layer can increase time needed to process a workpiece and reduce yield. If the conductive electrode members 534 would be thickened to have a thickness similar to the height of the gate electrodes, source-to-gate capacitive coupling may be unacceptably high because the conductive electrode members 534 are electrically connected to the source regions 644.

Thus, the configuration of the conductive electrodes 834 that include the conductive electrode members 534 and conductive electrode members 734 help to provide good shielding between the drains and gates of the transistors. Furthermore, conductive electrode members 734 of the conductive electrodes 834 allow for contact openings to be formed to both the gate electrodes 622 and conductive electrodes 834 at the same time without undue process complications or reducing processing margin.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a semiconductor layer, a first insulating layer overlying the semiconductor layer, a first conductive electrode member overlying the first insulating layer, and a second conductive electrode member overlying and spaced apart from the semiconductor layer. The first conductive electrode member can abut the second conductive electrode member, the second conductive electrode member can have a first end and a second end opposite the first end, and each of the semiconductor layer and the first conductive electrode member can be closer to the first end of the second conductive electrode member than to the second end of the second conductive electrode member.

Embodiment 2. The electronic device of Embodiment 1, further including a transistor having a gate electrode that is closer to the first conductive electrode member than to the second conductive electrode member.

Embodiment 3. The electronic device of Embodiment 2, further including a second insulating layer overlying the first conductive electrode member, wherein the second insulating layer defines a first contact opening and a second contact opening; a first conductive plug that abuts the gate electrode within the first contact opening; and a second conductive plug that abuts the second conductive electrode member.

Embodiment 4. The electronic device of Embodiment 3, wherein no contact opening through the second insulating layer extends to the first conductive electrode member.

Embodiment 5. The electronic device of Embodiment 2, wherein the first conductive electrode member has an uppermost point that lies at a first elevation, the second conductive electrode member has an uppermost point that lies at a second elevation, and the gate electrode has an uppermost point that lies at a third elevation that is closer to the second elevation than to the first elevation.

Embodiment 6. The electronic device of Embodiment 5, wherein a difference between the first and third elevations is at least approximately 0.4 micron, and a difference between the second and third elevations is no greater than approximately 0.2 micron.

Embodiment 7. The electronic device of Embodiment 2, wherein the transistor further includes a source region, wherein the source region and the first and second conductive electrode members are electrically connected to one another.

Embodiment 8. The electronic device of Embodiment 7, wherein the transistor further includes a drain region that includes a horizontally-oriented doped region that is disposed under the first insulating layer and the first conductive electrode member.

Embodiment 9. An electronic device can include a semiconductor layer, a first insulating layer overlying the semiconductor layer, and a first conductive electrode overlying the first insulating layer, wherein from a cross-sectional view, the first conductive electrode is substantially L-shaped.

Embodiment 10. The electronic device of Embodiment 9, further including a transistor that includes a drain region that includes a horizontally-oriented doped region that is disposed under the first insulating layer and the first conductive electrode.

Embodiment 11. The electronic device of Embodiment 10, further including a buried conductive region, wherein the semiconductor layer has a primary surface and an opposing surface, wherein the buried conductive region is disposed closer to the opposing surface than to the primary surface; and a vertical conductive region adjacent to the primary surface of the semiconductor layer and extending toward the buried conductive region, wherein the vertical conductive region is electrically connected to the buried conductive region and the horizontally-oriented lightly-doped region.

Embodiment 12. The electronic device of Embodiment 11, further including a second conductive electrode, wherein from a cross-sectional view, the second conductive electrode is substantially L-shaped; and from a top view, the vertical conductive region lies between the first and second conductive electrodes.

Embodiment 13. The electronic device of Embodiment 12, wherein each of the first and second conductive electrodes includes a horizontal portion with a first end and a second end opposite the first end, and a vertical portion adjacent to the second end and spaced apart from the first end; and from a top view, the vertical conductive region lies closer to the vertical portions of the first and second conductive electrodes than to the first ends of the horizontal portions of the first and second conductive electrodes.

Embodiment 14. The electronic device of Embodiment 13, wherein the transistor further includes a gate electrode that lies closer to: the first conductive electrode than to the second conductive electrode; and the first end of the first conductive electrode than to the second end of the first conductive electrode.

Embodiment 15. A process of forming an electronic device can include providing a semiconductor layer, forming a first insulating layer over the semiconductor layer, forming a first conductive electrode member over the first insulating layer, forming a patterned second insulating layer over the first conductive electrode member, wherein the patterned second insulating layer defines an opening having a bottom, and forming a second conductive electrode member within the opening of the patterned second insulating layer. The second conductive electrode member may lie along only a part, and not all, of the bottom of the opening, and the first conductive electrode member can abut the second conductive electrode member.

Embodiment 16. The process of Embodiment 15, wherein forming the second conductive electrode member includes forming a conductive layer over the patterned second insulating layer and within the opening, and anisotropically etching the conductive layer to form the second conductive electrode member.

Embodiment 17. The process of Embodiment 15, further including forming a gate electrode of a transistor over the semiconductor layer, wherein forming the gate electrode is performed after forming the first conductive electrode member, and forming the second conductive electrode member is performed after forming the gate electrode.

Embodiment 18. The process of Embodiment 15, further including providing a buried conductive region, wherein the semiconductor layer has a primary surface and an opposing surface, wherein the buried conductive region is disposed closer to the opposing surface than to the primary surface; and forming a vertical conductive region adjacent to the primary surface of the semiconductor layer and extending toward the buried conductive region, wherein the vertical conductive region is electrically connected to the buried conductive region.

Embodiment 19. The process of Embodiment 18, further including forming a horizontally-oriented doped region adjacent to the primary surface of the semiconductor layer and the first insulating layer, wherein in a finished device, the vertical conductive region is electrically connected to the horizontally-oriented doped region.

Embodiment 20. The process of Embodiment 18, further including forming a third insulating layer along an exposed side of the second conductive electrode member. Forming the vertical conductive region can be performed after forming the third insulating layer and can include etching the semiconductor layer to define a trench adjacent to the primary surface and extending toward the buried conductive region, wherein the trench has a bottom; and forming a conductive layer within the trench such that the conductive layer contacts the bottom of the trench, wherein the third insulating layer is disposed between the second conductive electrode member and the conductive layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
    a semiconductor layer;
    a first insulating layer overlying the semiconductor layer;
    a transistor having a gate electrode;
    a first conductive electrode comprising a first conductive electrode member and a second conductive electrode member, wherein:
        the first conductive electrode member overlies the first insulating layer;
        the second conductive electrode member overlies and is spaced apart from the semiconductor layer;

the first conductive electrode member abuts the second conductive electrode member;

the second conductive electrode member has a first end and a second end opposite the first end; and each of the semiconductor layer and the first conductive electrode member is closer to the first end of the second conductive electrode member than to the second end of the second conductive electrode member; and a second conductive electrode that includes a third conductive electrode member and a fourth conductive electrode member, wherein no conductive electrode is disposed between the first and second conductive electrodes.

2. The electronic device of claim 1, wherein the gate electrode is closer to the first conductive electrode member than to the second conductive electrode member.

3. The electronic device of claim 1, further comprising:
a second insulating layer overlying the first conductive electrode member, wherein the second insulating layer defines a first contact opening and a second contact opening;
a first conductive plug that abuts the gate electrode within the first contact opening; and
a second conductive plug that abuts the second conductive electrode member.

4. The electronic device of claim 3, wherein no contact opening through the second insulating layer extends to the first conductive electrode member.

5. The electronic device of claim 1, wherein:
the first conductive electrode member has an uppermost point that lies at a first elevation;
the second conductive electrode member has an uppermost point that lies at a second elevation; and
the gate electrode has an uppermost point that lies at a third elevation that is closer to the second elevation than to the first elevation.

6. The electronic device of claim 5, wherein:
a difference between the first and third elevations is at least approximately 0.4 micron; and
a difference between the second and third elevations is no greater than approximately 0.2 micron.

7. The electronic device of claim 1, wherein a first conductive electrode is substantially L-shaped and includes the first and second conductive electrode members.

8. The electronic device of claim 1, wherein each of the second and fourth conductive electrode members extends to an elevation higher than the first and third conductive electrode members.

9. The electronic device of claim 7, wherein:
the first conductive electrode member extends in a first lateral direction away from the second and fourth conductive electrode members;
the third conductive electrode member extends in a second lateral direction away from the second and fourth conductive electrode members;
the first and second lateral directions are opposite directions.

10. The electronic device of claim 1, wherein the gate electrode is not disposed between the first and second conductive electrodes.

11. The electronic device of claim 1, wherein a single conductive plug contacts the second and fourth conductive electrode members.

12. The electronic device of claim 1, wherein the transistor further comprises a source region, wherein the source region and the first and second conductive electrode members are electrically connected to one another.

13. The electronic device of claim 12, wherein the transistor further comprises a drain region that includes a horizontally-oriented doped region that is disposed under the first insulating layer and the first conductive electrode member.

14. The electronic device of claim 13, further comprising:
a buried conductive region underlying the semiconductor layer; and
a vertical conductive region that extends through the semiconductor layer and is electrically connected to the horizontally-oriented doped region and the buried conductive region,
wherein each of the first and second conductive electrode members is disposed between the gate electrode and the buried conductive region.

15. An electronic device comprising:
a semiconductor layer;
a first insulating layer overlying the semiconductor layer;
a transistor having a gate electrode;
a first conductive electrode member overlying the first insulating layer;
a second conductive electrode member overlying and spaced apart from the semiconductor layer, wherein:
the first conductive electrode member abuts the second conductive electrode member;
the second conductive electrode member has a first end and a second end opposite the first end;
each of the semiconductor layer and the first conductive electrode member is closer to the first end of the second conductive electrode member than to the second end of the second conductive electrode member;
the first conductive electrode member has an uppermost point that lies at a first elevation;
the second conductive electrode member has an uppermost point that lies at a second elevation; and
the gate electrode has an uppermost point that lies at a third elevation that is closer to the second elevation than to the first elevation.

16. The electronic device of claim 15, further comprises a second conductive electrode that includes a third conductive electrode member and a fourth conductive electrode member, wherein each of the second and fourth conductive electrode members extends to an elevation higher than the first and third conductive electrode members.

17. The electronic device of claim 16, wherein a single conductive plug contacts the second and fourth conductive electrode members and is spaced apart from the first and third conductive members.

18. The electronic device of claim 16, wherein the gate electrode is not disposed between the first and second conductive electrodes.

19. An electronic device comprising:
a semiconductor layer;
a first insulating layer overlying the semiconductor layer;
a transistor having a gate electrode and a source region;
a first conductive electrode member overlying the first insulating layer;
a second conductive electrode member overlying and spaced apart from the semiconductor layer, wherein:
the first conductive electrode member abuts the second conductive electrode member;
the second conductive electrode member has a first end and a second end opposite the first end;

each of the semiconductor layer and the first conductive electrode member is closer to the first end of the second conductive electrode member than to the second end of the second conductive electrode member; and the source region and the first and second conductive electrode members are electrically connected to one another.

20. The electronic device of claim 19, wherein the transistor further comprises a drain region that includes a horizontally-oriented doped region that is disposed under the first insulating layer and the first conductive electrode member.

21. The electronic device of claim 20, further comprising:

a buried conductive region underlying the semiconductor layer; and a vertical conductive region that extends through the semiconductor layer and is electrically connected to the horizontally-oriented doped region and the buried conductive region, wherein each of the first and second conductive electrode members is disposed between the gate electrode and the buried conductive region.

* * * * *